United States Patent [19]

Yoshizumi et al.

[11] 4,248,920
[45] Feb. 3, 1981

[54] RESIN-SEALED SEMICONDUCTOR DEVICE

[75] Inventors: Akira Yoshizumi, Yokohama; Hirotoshi Ikeya, Yokosuka; Moriyasu Wada, Kanagawa, all of Japan

[73] Assignee: Tokyo Shibaura Denki Kabushiki Kaisha, Kawasaki, Japan

[21] Appl. No.: 30,768

[22] Filed: Apr. 17, 1979

[30] Foreign Application Priority Data

Apr. 26, 1978 [JP] Japan ................... 53-48776
Jun. 28, 1978 [JP] Japan ................... 53-77459

[51] Int. Cl.$^3$ ............... B32B 27/38; B32B 1/04
[52] U.S. Cl. ................... 428/76; 260/28 P; 260/28 R; 428/484; 428/413; 357/72; 525/484
[58] Field of Search ........ 528/113; 525/484; 260/28 P, 28 R; 428/484, 413, 76; 357/72; 427/93

[56] References Cited

U.S. PATENT DOCUMENTS

| | | | |
|---|---|---|---|
| 3,301,795 | 1/1967 | Wooster | 528/113 |
| 3,639,657 | 2/1972 | Moran et al. | 528/113 |
| 3,813,379 | 5/1974 | Brouwers et al. | 260/37 EP |
| 3,838,094 | 9/1974 | Sporck | 260/37 EP |
| 3,849,187 | 11/1974 | Fetscher et al. | 357/72 |
| 4,042,550 | 8/1977 | Tuller et al. | 260/28 P |
| 4,042,955 | 8/1977 | Imai et al. | 357/72 |
| 4,092,487 | 5/1978 | Imai et al. | 357/72 |
| 4,104,698 | 8/1978 | Muratas et al. | 260/28 P |

FOREIGN PATENT DOCUMENTS 51-21839 7/1976 Japan .
52-975 1/1977 Japan .

Primary Examiner—George F. Lesmes
Assistant Examiner—E. Rollins Buffalow
Attorney, Agent, or Firm—Oblon, Fisher, Spivak, McClelland & Maier

[57] ABSTRACT

A semiconductor device sealed in a resin composition, wherein the resin composition contains the prescribed percentages of inorganic fillers having extremely small amounts of impurities, epoxy resin having an epoxy equivalent of 250 or less and a softening point of 120° C. or less, hardening agent, hardening promoter and low melting paraffins.

17 Claims, 1 Drawing Figure

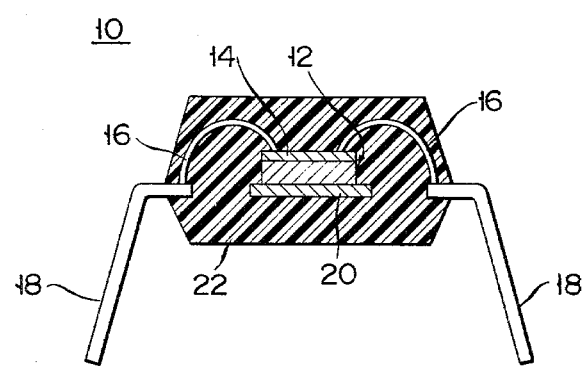

RESIN-SEALED SEMICONDUCTOR DEVICE

BACKGROUND OF THE INVENTION

1. Field of the Invention

This invention relates to a semiconductor device, and more particularly to a semiconductor device sealed in a synthetic resin composition.

2. Description of the Prior Art

In recent years, electron circuit parts such as a semiconductor device, resistor, capacitor and coil are more favorably sealed or molded in thermosetting resin, thereby reducing a packaging cost. In this case, low pressure molding type epoxy resin composition is generally accepted as a molding material for the above-mentioned object. However, with respect to the sealing of a semiconductor device such as a transistor, IC elements and LSI elements, the sealing by the prior art epoxy resin composition has been found less advantageous than the hermetic sealing process using glass, metal or ceramics, in that said epoxy resin sealing has lower moisture resistance, thereby reducing the reliable performance of a semiconductor device sealed in said epoxy resin composition. The reason for this is that an epoxy resin composition applied by the customary sealing process contains epoxy resin, additives such as a hardening agent and inorganic filler, and impurities included in the components of said epoxy resin composition tend to be ionized in the presence of moisture. The resultant ions corrode a layer of metal, for example, aluminum used as an electrode of a semiconductor device, thus deteriorating the quality of said electrode metal. This phenomenon is a main factor of lowering the reliability of the semiconductor device.

Assiduous efforts have been made to eliminate the above-mentioned drawbacks accompanying the conventional epoxy resin-sealing process. However, considerable difficulties have been experienced in completely removing particularly sodium and chlorine carried into epoxy resin during its manufacture. To date, therefore, no satisfactory results have been achieved.

SUMMARY OF THE INVENTION

It is accordingly an object of this invention to provide a resin-sealed semiconductor device whose reliability is not lowered.

According to this invention, there is provided a resin-sealed semiconductor device, comprising:

a body of a semiconductor device; and a solid package formed of an epoxy resin composition sealing the body of the semiconductor device, said epoxy resin composition comprising:

(a) 65 to 80% by weight of an inorganic powder filler having a low concentration of impurities such that it provides an aqueous solution exhibiting an electric conductivity of 10 $\mu$ ʊ/cm or less when extracted in boiling water;

(b) 10 to 25% by weight of epoxy resin having an epoxy equivalent of 250 or less and a softening point of 120° C. or less;

(c) 5 to 25% by weight of a hardening agent selected from the group consisting of phenolic resins, organic acid anhydrides and mixtures thereof;

(d) 0.1 to 1.0% by weight of a hardening promotor; and (e) 0.05 to 1.50% by weight of low melting paraffins.

A semiconductor device package embodying this invention has a high moisture resistance and fully protects a semiconductor device including a metal layer such as an aluminum electrode from ambient moisture and its environment, thereby effectively resolving difficulties encountered in the prior art epoxy resin-sealed semiconductor device.

BRIEF DESCRIPTION OF THE DRAWING

The appended drawing is a cross sectional view of a resin-sealed semiconductor device according to this invention.

DETAILED DESCRIPTION OF THE PREFERRED EMBODIMENTS

The accompanying drawing shows a DIP type resin-sealed semiconductor device 10. A semiconductor device 12 such as a transistor, IC element or LSI element which is provided with a bed 20 is sealed in the later described resin package 22. The electrode 14 of the semiconductor device 12 is formed of a vapor-deposited aluminum layer, and connected through a gold or aluminum bonding wire 16 to a lead plate 18 extending outside of the package 22.

An epoxy resin composition according to this invention which constitutes the package 22 contains, as previously described, 65 to 80% by weight of an inorganic powder filler such as alumina, magnesium carbonate, quartz, mica, glass and antimony trioxide. Since the inorganic powder filler is included in a resin composition used with a semiconductor device, it is demanded to have an extremely low concentration of impurities. As used herein, the content of impurities is defined by the electric conductivity of an aqueous solution obtained when 10 parts by weight of an inorganic filler are extracted in 100 parts by weight of pure boiling water for 5 hours. An inorganic powder filler used with this invention is chosen to exhibit the electric conductivity of 10 $\mu$ ʊ/cm or less, preferably 5 $\mu$ ʊ/cm or less as measured at 20° C. The pH of the extract solution generally ranges between 6.0 and 7.5.

A part of the above-mentioned inorganic fillers may be substituted with powder of calcium carbonate, clay, kaolin, alumina hydrate, asbesto or the like within the range such that the resultant mixture can exhibit the prescribed electric conductivity.

The above-mentioned inorganic powder filler have, in general, a particle size sufficiently fine to provide a resin composition having a flow characteristic adapted for the sealing of a semiconductor device, particularly for low pressure transfer molding.

The package of a semiconductor device is demanded to have a small linear thermal expansion coefficient in order to protect a semiconductor device sealed in said package from being damaged when the whole mass is often subjected to cooling and heating cycle in practical application.

Therefore, the inorganic powder filler itself is preferred to have a sufficiently small thermal expansion coefficient, for example, $1.0 \times 10^{-5}$/°C. or less, preferably $0.5 \times 10^{-6}$/°C. or less.

Generally, the larger the addition of a filler to a resin composition, the more reduced the thermal expansion coefficient thereof. However, an increased addition of a filler has the drawbacks that a molten resin composition decreases in fluidity, probably tending to give rise to the breakage of the bonding wire 16 connecting the semiconductor device 12 to the lead plate 18. The epoxy resin composition according to this invention has been developed in consideration of the above-mentioned circumstances.

According to one preferred embodiment of this invention, fused silica powder having the following particle size distribution is used at the rate of 65 to 75% by weight.

| Particle size | % by weight |
| --- | --- |
| Less than 44 μ | 70 to 90% (including at least 20% by weight, preferably at least 25% by weight, based on the total weight of 44 μ > size, of particle sizes smaller than 8 μ) |
| 44 μ to less than 74 μ | 5 to 25%, preferably 10 to 20% |
| 74 μ to less than 149 μ | 2 to 16%, preferably 2 to 8% |
| 149 μ or more | 3% or less |

The above-mentioned fused silica powder has as low a thermal expansion coefficient as $5.0 \times 10^{-7}/°C$. or less.

Where this fused silica powder is used in a smaller amount than 65% by weight, a produced package has an increased thermal expansion coefficient. The resultant drawbacks are that a gap arises between the lead plate 18 and package, leading not only to a decline in the moisture resistance of the pakage but also to the occurrence of strains in the interior of a semiconductor device sealed in said package with a harmful effect on its quality. Conversely where the fused silica powder is used in a larger amount than 75% by weight, then the resultant resin composition flows less smoothly during molding. Where, therefore, a resin-sealed semiconductor device is often subjected to cooling and heating cycle in practical application, then said semiconductor device tends to have its circuit left open and fails to be used as such. The fused silica powder is preferably used within the range of 67 to 73% by weight.

According to another preferred embodiment, crystalline silica powder having the following particle size distribution and an average particle size of 4 to 8μ is used at the rate of 68 to 80% by weight.

| Particle size | % by weight |
| --- | --- |
| Less than 48 μ | 60 to 95% (including at least 55% by weight, preferably 65% by weight, based on the total weight of 48 μ > size, of particles less than 19 μ) |
| 149 μ or more | 0.5% or less |

The above-mentioned proportion of 68 to 80% by weight at which the crystalline silica powder is applied is chosen for the same reason as that given for the proportion of application of the aforesaid fused silica powder. The crystalline silica powder should preferably be applied at the rate falling within the range of 70 to 75% by weight. The crystalline silica powder has a thermal expansion coefficient slightly larger than the fused silica powder, but raises no practical problem. The crystalline silica powder effectively dissipates heat and is adapted particularly for the sealing of a large capacity semiconductor device.

When another inorganic filler, for example, antimony trioxide (concurrently acting as a flame retardant) is added to the fused or crystalline silica powder having the above-described particle size distribution, the resultant filler mixture is preferred to have a particle size distribution conforming to that of the silica powder.

Epoxy resin used with this invention has an epoxy equivalent of 250 or less and a softening point of 120° C. or less. Where the epoxy equivalent exceeds 250, the crosslink density drops, resulting in the failure of a resin-sealed semiconductor device to have a sufficient heat resistance and mechanical strength. Where the softening point rises above 120° C., the resultant resin composition declines in fluidity and becomes unadapted for molding. It is preferred that the epoxy equivalent be 200 to 230, and the softening point be 90° C. or less.

The above-defined type of epoxy resin can be selected from those having at least two epoxy groups in the molecule including bisphenol A type epoxy resins, phenolnovolak type epoxy resins, cresol-novolak type epoxy resins, alicyclic epoxy resin, and halogenated derivatives thereof. Most of these epoxy compounds are commercially available. In this connection, refer, for example, to Table 5.2 entitled "Kinds and properties of main marketed epoxy resins" given on pages 43 to 47 of "Epoxy Resins", 7th Edition, compiled by Hoshimoto (published in 1976 by Nikkan Kogyo Shimbun Sha, Japan) and "Handbook of Epoxy Resins" by Lee and Neville (published by McGraw-Hill). As previously mentioned, sodium and chlorine are necessarily carried into epoxy resin during its manufacture. Therefore, such impurities should preferably be removed to the greatest possible extent, for example, by washing with water or steam distillation. For the object of this invention, the above-mentioned epoxy resin is used at the rate of 10 to 25% by weight, preferably 15 to 20% by weight.

Phenolic resins and/or organic acid anhydrides are used as a hardening agent for the above-defined epoxy resin and are applied at the rate of 5 to 25% by weight, preferably 15 to 20% by weight. The phenolic resins are known in the art and include, for example, those prepared by reacting phenol, cresol, xylenol, resorcinol, chlorophenol, phenylphenol, or bisphenol or mixtures thereof with formaldehyde or paraformaldehyde, using an acid, base or neutral salt as a catalyst. The phenolic resins are demanded to contain no more than 0.7% by weight of unreacted monomers in order to elevate the crosslink density of the resin composition of this invention used as a package for a semiconductor device and avoid the harmful effect of said unreacted monomers on a semiconductor device sealed in the package. Unreacted monomers can be easily eliminated by a known process, such as vacuum distillation, or washing with hot water or vapor. The phenolic resins as used in this invention preferably have a phenol equivalent of 200 or less.

The organic acid anhydrides include phthalic anhydride, maleic anhydride, tetrahydrophthalic anhydride, endomethylenetetrahydrophthalic anhydride, trimellitic anhydride, cyclohexene-1, 2-dicarboxylic acid anhydride, cyclohexene-3, 4-dicarboxylic acid anhydride and mixtures of two or more of these.

Hardening promoters used with the package resin composition of this invention include customarily used amines (for example, diethylenetriamine, triethylenetetramine, diethylaminopropylamine, methaphenylenediamine, N-aminoethylpiperazine, benzyldimethylamine), complexes of trifluoroboron with amines (for example, complex of trifluoroboron with monoethylamine) and imidazole compounds (for example, ethylmethyl imidazole). These hardening promoters are applied at the rate of 0.1 to 1.0% by weight, preferably 0.2 to 0.8% by weight.

The package resin composition of this invention contains 0.05 to 1.5% by weight of low melting paraffins to elevate its moisture resistance and fluidity. Application of this additive constitutes one of the characteristics of the invention. Where the rate of application falls below 0.05% by weight, then the advantageous effect of moisture resistance sometimes tends to decrease from a desired level. Conversely, where the rate of application goes beyond 1.5% by weight, then the surface of the resultant package becomes less printable. The low melting paraffins should preferably be applied at the rate of 0.1 to 0.7% by weight.

The above-mentioned low melting paraffins include those fluidizable at room temperature, for example, liquid paraffin, or those having a viscosity of 10 poises or less at 120° C. For the object of this invention, the low melting paraffins may be partly modified by esterification, etc.

If desired, it is possible to mix an organic flame retardant such as brominated epoxy resin, an inorganic flame retardant such as antimony trioxide, coloring matter such as carbon black, a coupling agent, a mold-releasing agent, a denaturing agent, and a deterioration inhibitor with the package resin composition of this invention in small but sufficient amounts to impart the properties of the respective additives to said resin composition. When halogenated epoxy resin is used as a flame retardant and happens to have an epoxy equivalent of more than 250 and/or a softening point of more than 120° C., it is added to the resin composition in an amount such that the content of halogen in the resultant composition should not exceed 3% by weight.

A resin-sealed semiconductor device according to this invention is manufactured by the following steps. The respective components of the subject resin composition are mixed into a molten state by heating rolls, kneader or extruder, or pulverizing said components and mixing the pulverized powders by a special mixer, or fully mixing said components by a proper combination of the above-mentioned heating rolls, kneader and extruder. After cooled to room temperature, the mixed mass is crushed to form molding material. This molding material is molded by the customary low pressure transfer molding process (the so-called encapsulation molding process) to seal the semiconductor device. The resin composition can be cured at a mold temperature of 150° to 190° C., a molding pressure of 50 to 200 kg/cm$^2$ and for 45 seconds to 3 minutes.

This invention will be more fully understood from the following examples. Throughout the examples, all parts and percentages are by weight, unless otherwise expressly indicated.

EXAMPLES

Eleven molding resin compositions including controls were prepared from orthocresol novolak type epoxy resin having an epoxy equivalent of 220 and softening point of 80° C.; a hardening agent A (phenol novolak resin having a phenol equivalent of 105); a hardening agent B (phthalic acid anhydride); a hardening promotor A (imidazole compound); a hardening promoter B (tertiary amine); a mold releasing agent (carnauba wax); an organic flame retardant (brominated epoxy resin having an epoxy equivalent of 270 and softenning point of 86° C.); an inorganic flame retardant (antimony trioxide); liquid paraffin; a coupling agent (manufactured by UCC Co., Ltd. under the trademark "A 187"); a coloring matter (carbon black); and fillers A, B, C and D applied at the rates (% by weight indicated in Table 1 below). The kinds and particle size distributions of the fillers A and B formed of fused silica powder and the fillers C and D prepared from crystalline silica powder are shown in Table A and Table B respectively. Inorganic flame retardants used with the fillers A, B, C and D were chosen to have the particle size distributions such that the particle size distribution of the resultant mixed powder fell within that of said fillers.

TABLE A

| | Fused silica powder | |
| Particle size range | Filler A | Filler B |
| --- | --- | --- |
| 149 μ < | 0.5% | 5.0% |
| 149 μ ~ 74 μ | 2.1% | 17.0% |
| < 74 μ ~ 44 μ | 15.4% | 26.0% |
| < 44 μ (< 8μ) | 82.0% (24.0%) | 52.0% (13.0%) |

TABLE B

| | Crystalline silica powder | |
| Particle size range | Filler C | Filler D |
| --- | --- | --- |
| 48 μ ≧ | 65.8% | 55.0% |
| 149 μ ≦ | trace | 1.0% |
| 19μ ≥ | 50.0% | 40.0% |
| Average particle size | 7.0 μ | 9.0 μ |

TABLE 1

| | | Examples | | | | | | | | Controls | | |
| | | 1 | 2 | 3 | 4 | 5 | 6 | 7 | 8 | 1 | 2 | 3 |
| --- | --- | --- | --- | --- | --- | --- | --- | --- | --- | --- | --- | --- |
| Epoxy resin | | 16.0 | 16.0 | 14.0 | 15.0 | 15.0 | 12.0 | 13.5 | 13.5 | 16.0 | 16.3 | 15.0 |
| Hardening agent | A | 9.9 | 9.9 | — | 8.0 | 8.0 | 6.4 | — | — | 9.9 | 10.1 | 8.0 |
| | B | — | — | 12.9 | — | — | — | 10.0 | 10.0 | — | — | — |
| Hardening promoter | A | 0.5 | 0.5 | — | 0.8 | 0.8 | 0.7 | — | — | 0.5 | 0.5 | 0.8 |
| | B | — | — | 0.3 | — | — | — | 0.3 | 0.3 | — | — | — |
| Mold releasing agent | | 0.3 | 0.3 | 0.3 | 0.3 | 0.3 | 0.3 | 0.3 | 0.3 | 0.3 | 0.3 | 0.3 |
| Flame retardant | Organic | 2.4 | 2.4 | 2.4 | 2.0 | 2.0 | 1.6 | 2.0 | 2.0 | 2.4 | 2.4 | 2.0 |
| | Inorganic | 1.8 | 1.8 | 1.8 | 2.0 | 2.0 | 2.0 | 2.0 | 2.0 | 1.8 | 1.8 | 2.0 |
| Liquid paraffin | | 0.5 | 0.3 | 0.5 | 0.3 | 0.6 | 0.3 | 0.3 | 0.6 | 0.5 | — | — |
| Coupling agent | | 0.2 | 0.4 | 0.2 | 0.3 | 0.3 | 0.3 | 0.3 | 0.3 | 0.2 | 0.2 | 0.3 |
| Coloring matter | | 0.3 | 0.3 | 0.3 | 0.3 | 0.3 | 0.3 | 0.3 | 0.3 | 0.3 | 0.3 | 0.3 |
| Fillers | A | 68.1 | 68.1 | 68.1 | — | — | — | — | — | — | 68.1 | — |
| | B | — | — | — | — | — | — | — | — | 68.1 | — | — |
| | C | — | — | — | 71.0 | 70.7 | 76.1 | 71.0 | 70.7 | — | — | — |
| | D | — | — | — | — | — | — | — | — | — | — | 71.3 |
| Heat conductivity (× 10$^{-3}$) (cal / deg. cm . sec) | | 1.5 | 1.5 | 1.5 | 4.0 | 4.0 | 4.4 | 4.1 | 4.0 | 1.5 | 1.5 | 4.2 |

TABLE 1-continued

|  |  | Examples | | | | | | | | Controls | | |
|---|---|---|---|---|---|---|---|---|---|---|---|---|
|  |  | 1 | 2 | 3 | 4 | 5 | 6 | 7 | 8 | 1 | 2 | 3 |
| Moisture resis- | 200 hr | 0/30 | 0/30 | 0/30 | 0/30 | 0/30 | 0/30 | 0/30 | 0/30 | 0/30 | 0/30 | 1/30 |
| tance deteriora- | 500 hr | 0/30 | 0/30 | 0/30 | 0/30 | 0/30 | 0/30 | 0/30 | 0/30 | 4/30 | 1/30 | 15/29 |
| tion test | 1000 hr | 0/30 | 0/30 | 0/30 | 0/30 | 0/30 | 1/30 | 2/30 | 1/30 | 10/26 | 7/29 | 14/14 |
|  | 1500 hr | 2/30 | 3/30 | 3/30 | 3/30 | 2/30 | 4/29 | 7/28 | 5/29 | 15/16 | 15/22 |  |

Each of the above-listed resin compositions was prepared by the following steps. After the filler, flame retardant, carbon black and hardening promoter were mixed, liquid paraffin and coupling agent were added to the mixture. After addition of the remaining components, the whole mass was kneaded by heating rolls at 60° to 100° C. After cooled to room temperature, the mass was crushed to form a molding material.

An MOS IC device was embedded in a package molded from each of the above-mentioned resin compositions by the low pressure transfer molding process. A pressure-cooker test was made of the respective resin-sealed semiconductor devices to determine the moisture resistance deterioration of the samples in steam compressed to 2 atmospheres, the results being set forth also in Table 1 above.

The tested samples were evaluated as follows. Those samples were disqualified in which the circuit of an aluminum electrode was left open due to corrosion and current leaked at the rate exceeding an allowable limit due to the seeping of water into a layer of molded resin composition. Table 1 shows the ratio of a number of good products to that of defective ones as counted with respect to the respective samples. The left term of each ratio value denotes a number of disqualified samples. As apparent from Table 1, a resin-sealed semiconductor device according to this invention indicates stable properties over long hours, proving to have a high reliability.

What we claim is:

1. A resin-sealed semiconductor device comprising:
   a body of a semiconductor device; and
   a solid package formed of an epoxy resin composition sealing the body of the semiconductor device, said epoxy resin composition comprising:
   (a) 65 to 75% by weight of an inorganic powder filler having a low concentration of impurities such that it provides an aqueous solution exhibiting an electric conductivity of 10 $\mu v$/cm or less when extracted in pure boiling water, said inorganic powder filler comprising a fused silica powder composed of 70 to 90% by weight of first particles less than 44$\mu$, 5 to 25% by weight of second particles 44$\mu$ to less than 74$\mu$, 2 to 16% by weight of third particles 74$\mu$ to less than 149$\mu$, and 3% by weight or less of fourth particles 149$\mu$ or more, at least 20% by weight of the total amount of said first particles consisting of fifth particles less than 8$\mu$;
   (b) 10 to 25% by weight of epoxy resin having an epoxy equivalent of 250 or less and a softening point of 120° C. or less;
   (c) 5 to 25% by weight of a hardening agent selected from the group consisting of phenolic resins, organic acid anhydrides and mixtures thereof;
   (d) 0.1 to 1.0% by weight of a hardening promoter; and
   (e) 0.05 to 1.50% by weight of low melting paraffins.

2. The device according to claim 1, wherein said fused silica powder is incorporated in an amount of 67 to 73% by weight in the epoxy resin composition.

3. The device according to claim 1, wherein said first particles are composed of at least 25% by weight of said fifth particles.

4. The device according to claim 1, wherein said second particles occupy 10 to 20% by weight of said fused silica powder.

5. The device according to claim 1, wherein said third particles occupy 2 to 8% by weight of said fused silica powder.

6. The device according to claim 1, wherein said electric conductivity is 5 $\mu v$/cm or less.

7. A resin-sealed semiconductor device comprising:
   a body of a semiconductor device; and
   a solid package formed of an epoxy resin composition sealing the body of the semiconductor device, said epoxy resin composition comprising:
   (a) 68 to 80% by weight of an inorganic powder filler having a low concentration of impurities such that it provides an aqueous solution exhibiting an electric conductivity of 10 $\mu v$/cm or less when extracted in pure boiling water, said inorganic powder filler comprising a crystalline silica powder having an average particle size of 4$\mu$ to 8$\mu$ and composed of 60 to 95% by weight of first particles 48$\mu$ or less, and 0.5% by weight or less of second particles 149$\mu$ or more, at least 55% by weight of the total amount of said first particles consisting of third particles 19$\mu$ or less;
   (b) 10 to 25% by weight of epoxy resin having an epoxy equivalent of 250 or less and a softening point of 120° C. or less;
   (c) 5 to 25% by weight of a hardening agent selected from the group consisting of phenolic resins, organic acid anhydrides and mixtures thereof;
   (d) 0.1 to 1.0% by weight of a hardening promotor; and
   (e) 0.05 to 1.50% by weight of low melting paraffins.

8. The device according to claim 7, wherein said crystalline silica is incorporated in an amount of 70 to 75% by weight in the epoxy resin composition.

9. The device according to claim 7, wherein said first particles are composed of at least 65% by weight of said third particles.

10. The device according to any of claims 1, 2, 3, 4, 5, 6, 7, 8 or 9, wherein said epoxy resin is incorporated in an amount of 15 to 20% by weight in the epoxy resin composition.

11. The device according to claim 10, wherein said epoxy resin has an epoxy equivalent of 200 to 230.

12. The device according to claim 11, wherein said epoxy resin has a softening point of 90° C. or less.

13. The device according to claim 7 or 10, wherein said hardening agent is incorporated in an amount of 15 to 20% by weight in the epoxy resin composition.

14. The device according to claim 7 or 10, wherein said phenolic resin has a phenol equivalent of 200 or less.

15. The device according to claim 7 or 10, wherein said hardening promoter is incorporated in an amount of 0.2 to 0.8% by weight in the epoxy resin composition.

16. The device according to claim 7 or 10, wherein said paraffin is incorporated in an amount of 0.1 to 0.7% by weight in the epoxy resin composition.

17. The device according to claim 16, wherein said paraffin is liquid paraffin.

* * * * *